United States Patent
Moehlmann

(10) Patent No.: US 9,893,876 B2
(45) Date of Patent: Feb. 13, 2018

(54) PHASE LOCKED LOOP WITH REDUCED NOISE

(71) Applicant: NXP B.V.

(72) Inventor: Ulrich Moehlmann, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/156,584

(22) Filed: May 17, 2016

(65) Prior Publication Data

US 2016/0344538 A1 Nov. 24, 2016

(30) Foreign Application Priority Data

May 20, 2015 (EP) .................................... 15168348

(51) Int. Cl.
| | | |
|---|---|---|
| *H03D 3/24* | (2006.01) | |
| *H04L 7/033* | (2006.01) | |
| *H03L 7/093* | (2006.01) | |
| *H03L 7/091* | (2006.01) | |
| *H03L 7/099* | (2006.01) | |
| *H04B 1/12* | (2006.01) | |

(52) U.S. Cl.
CPC ............ *H04L 7/0331* (2013.01); *H03L 7/091* (2013.01); *H03L 7/093* (2013.01); *H03L 7/0991* (2013.01); *H04B 1/12* (2013.01); *H03L 2207/50* (2013.01)

(58) Field of Classification Search
CPC ... H04L 7/0331; H03L 7/093; H03L 2207/50; H03L 7/091; H03L 7/0991; H03L 7/089; H03L 7/085; H04B 1/12
USPC ............... 375/373–376; 331/25, 16; 327/156
See application file for complete search history.

(56) References Cited

U.S. PATENT DOCUMENTS

| | | | | |
|---|---|---|---|---|
| 6,188,288 B1* | 2/2001 | Ragan | ..................... | H03L 7/085 331/16 |
| 2007/0195917 A1* | 8/2007 | Landmark | ............... | H03L 7/093 375/376 |
| 2009/0108891 A1* | 4/2009 | Sander | .................... | H03L 7/085 327/156 |
| 2010/0097150 A1* | 4/2010 | Ueda | ........................ | H03L 7/089 331/25 |
| 2011/0279975 A1* | 11/2011 | Shimizu | .................... | H02P 7/29 361/695 |
| 2015/0341042 A1* | 11/2015 | Balachandran | ......... | H03L 7/099 327/156 |

OTHER PUBLICATIONS

Extended European Search Report for Patent Appln. No. 15168348.9 (dated Nov. 6, 2015).

(Continued)

*Primary Examiner* — Phuong Phu
(74) *Attorney, Agent, or Firm* — Rajeev Madnawat

(57) ABSTRACT

A phase locked loop, comprising: a phase detector configured to determine a phase difference ($\Delta\varphi$) between a reference signal and a feedback signal; a loop filter configured to perform a filtering operation on a signal derived from the phase difference, and to provide a control signal; a frequency controlled oscillator configured to receive the control signal and provide an output signal with a frequency that varies according to the control signal; wherein a low-pass filter is provided between the phase detector and the loop filter and/or between the loop filter and the frequency controlled oscillator to reduce quantization noise from the phase detector.

17 Claims, 6 Drawing Sheets

(56) References Cited

OTHER PUBLICATIONS

Zhuo, H. et al "A 1.5GHz All-Digital Frequency-Locked Loop with 1-bit ΔΣ Frequency Detection in 0.18 pm CMOS", Intnl. Symp. on VLSI Design, Automation and Test, 4 pgs. (2014).
Gagnon, G. et a "An FPGA-Based Wideband PLL without significant quantization noise", The 2nd Annual IEEE Northeast Workshop on Circuits and Systems, pp. 21-22 (2004).
Staszewski, B. Advanced Engineering Course on PLLs: Advanced Techniques, Mead Education SA, 119 pgs. (Jun. 2014).
Staszewski, B. et a "All-Digital PLL and GSM/EDGE Transmitter in 90nm CMOS", IEEE International Solid-State circuits Conference, 3 pgs. (2015).

* cited by examiner

PHASE LOCKED LOOP WITH REDUCED NOISE

CROSS-REFERENCE TO RELATED APPLICATIONS

This application claims the priority under 35 U.S.C. §119 of European Patent application no. 15168348.9, filed on May 20, 2015, the contents of which are incorporated by reference herein.

FIELD

The present disclosure relates to a phase locked loop with reduced quantization noise.

BACKGROUND

Phase locked loops (or PLLs) are used to generate an output signal with a defined phase relationship to an input reference signal. The output signal is matched to the phase of the input reference signal by a feedback loop in which the phase difference between the input reference signal and the output signal is determined by a phase detector. In a digital phase locked loop, the phase detector outputs a digital signal. The output from the phase detector (indicating phase error) is received by a loop filter. The loop filter in turn provides an output signal to a frequency controlled oscillator. In an all-digital phase locked loop, the phase detector may output a digital signal, the loop filter may be a digital loop filter, and the frequency controlled oscillator may be a digitally controlled oscillator.

Phase locked loops are often required to achieve a specific noise performance. The maximum allowable phase noise may be determined by an intended application for a phase locked loop.

Sources of phase noise in a phase locked loop may include: external oscillator noise (resulting from an imperfect reference oscillator signal); frequency controlled oscillator noise, and quantization noise, arising from quantization of the phase error at the phase detector.

A phase locked loop with reduced noise is desirable.

SUMMARY

According to a first aspect, there is provided a phase locked loop, comprising:
a phase detector configured to determine a phase difference between a reference signal and a feedback signal;
a loop filter configured to perform a filtering operation on a signal derived from the phase difference and to provide a control signal;
a frequency controlled oscillator configured to receive the control signal and provide an output signal with a frequency that varies according to the control signal;
wherein a low-pass filter is provided between the phase detector and the loop filter and/or between the loop filter and the frequency controlled oscillator, to reduce quantization noise from the phase detector.

The phase locked loop may have a bandwidth defined by the characteristics of the phase detector, loop filter and frequency controlled oscillator. The low pass filter may have a cut-off frequency that is greater than the bandwidth. The low pass filter may thereby suppress out-of-band quantization noise, without substantially affecting loop stability and performance.

The low-pass filter may have a cut-off frequency at least 1.2 times the bandwidth. The low-pass filter may have a cut-off frequency of at least: 1.1, 1.2, 1.3, 1.4, 1.5, 1.6, 1.7, 1.8, 1.9 or 2 times the bandwidth.

The low-pass filter may have a cut-off frequency that is at least 100 kHz greater than the bandwidth. The low lass filter may have a cut-off frequency that is at least 50, 200, 300, or 500 kHz greater than the bandwidth.

The low-pass filter may comprise a first order IIR (infinite impulse response) filter. The low-pass filter may comprise a second order IIR filter. The low-pass filter may be a finite impulse response filer. The low-pass filter may be a digital filter. A first order digital IIR filter is simple and effective in some applications.

The low-pass filter may comprise a shift multiplier in a forward path thereof, for multiplying by an integer power of two. A shift multiplier may be a convenient way to provide a multiplication function.

The loop filter may comprise an integral path comprising an integrator.

The loop filter may comprise a proportional path.

The phase locked loop may be configured with: a proportional gain factor $k_p$ in the proportional path and an integral gain factor $k_i$ prior to the integrator in the integral path. Optionally, $k_p \leq 2^{-12}$; and/or $k_i \leq 2^{-18}$.

The frequency controlled oscillator may comprise a switched capacitor LC oscillator. The frequency controlled oscillator may be a digitally controlled oscillator. Alternatively, the frequency controlled oscillator may be a voltage controlled oscillator (e.g. having a varactor).

The control signal may be a digital signal.

The output signal from the phase detector may be a digital signal.

The loop filter may be a digital loop filter.

The phase locked loop may be an all-digital phase locked loop.

A transmitter or receiver is provided, comprising the phase locked loop according to the first aspect.

The receiver may be a satellite radio receiver.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

Figure 1:
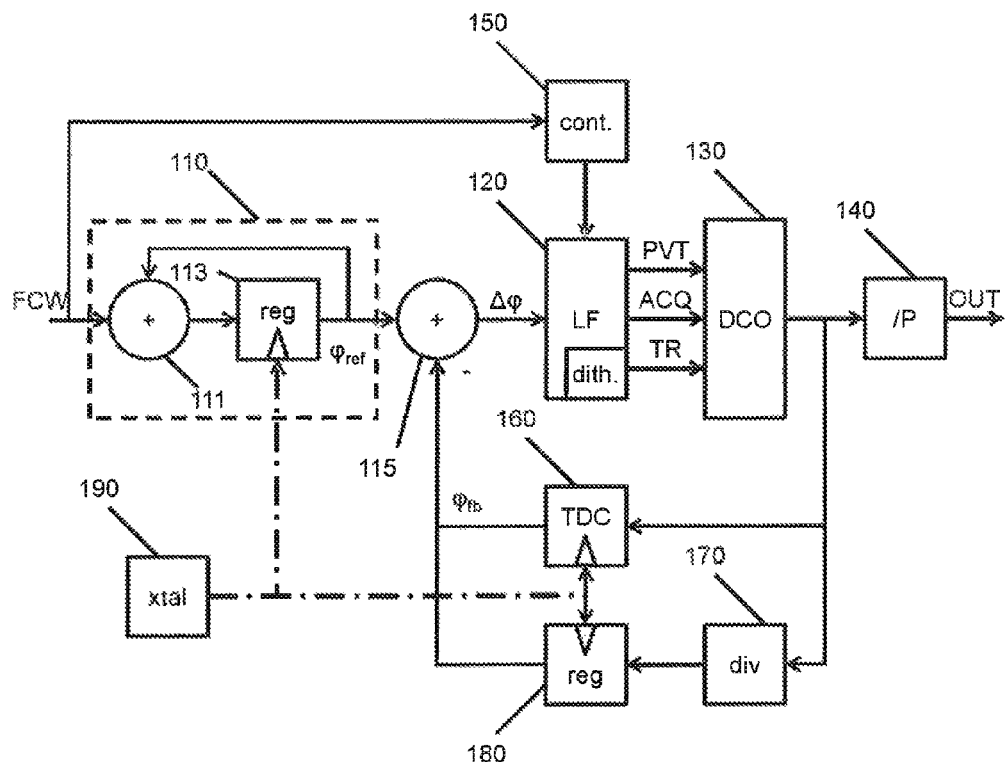
FIG. 1 is a block diagram of a phase locked loop.

It should be noted that the figures are diagrammatic and not drawn to scale. Relative dimensions and proportions of parts of these figures have been shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

FIG. 1 is a block diagram of a (all-) digital phase locked loop, comprising a reference phase generator 110, phase detector 115, loop filter 120, digitally controlled oscillator (DCO) 130, post divider 140, control block 150, time to digital converter (TDC) 160, frequency divider 170, feedback register 180 and crystal 190.

The crystal 190 provides an output signal with a stable frequency (e.g. 60 MHz), which is used to clock the TDC 160, feedback register 180 and the register 113 of the reference phase generator 110.

The reference phase generator 110 comprises an adder 111 and register 113, arranged to integrate an input frequency control word FCW, and provide a reference phase ramp $\varphi_{ref}$.

A phase detector 115 compares the reference phase ramp $\varphi_{ref}$ with a feedback ramp $\varphi_{fb}$ derived from the output of the DCO 130, and outputs a phase error signal $\Delta\varphi$. The feedback ramp $\varphi_{fb}$ is determined by combining (e.g. by fixed point concatenation) the output from the feedback register 180 and the TDC 160.

The loop filter 120 receives the phase error signal $\Delta\varphi$, and performs a filtering operation. The loop filter 120 in this example is controlled by a control block 150, which may vary the configuration of the loop filter 120 (e.g. depending on the set FCW). The loop filter 120 provides three output signals for controlling the DCO 130, these being a process voltage temperature control signal PVT, an acquisition control signal ACQ, and a tracking signal TR. Each of these control signals may control a switched capacitor bank of the DCO 130, so as to vary the output frequency of the DCO 130. Other frequency control mechanisms, such as digital to analog converters with varactors may be used in alternative arrangements.

The output from the DCO 130 is received at the frequency divider 170 and the TDC 160. The TDC measures and quantizes the timing difference between transitions of the output signal from the crystal 190 and the transitions in the output from the DCO 130. The frequency divider 170 divides the output frequency of the DCO to produce a signal with reduced frequency. The output from the frequency divider 170 is received at the feedback register 180, which accumulates a count of the transitions in the output of the divider The post divider 140 receives the output from the DCO 130, and divides the frequency by a factor, P, so as to provide an output signal from the phase locked loop at an appropriate frequency.

As an illustrative example, the output from the DCO 130 may have a frequency of around 5 GHz. The tuning range of the DCO 130 may be around 2.5 MHz. The post divider factor P may be 50, resulting in a phase locked loop output frequency of 100 MHz and a tuning range of 50 kHz. The PVT capacitor bank of the DCO 130 may have a tuning resolution of around 10 MHz, the ACQ capacitor bank may have a tuning resolution of around 0.5 to 1 MHz, and the TR capacitor bank may have a tuning resolution on the order of 10 to 50 kHz.

The DCO 130 and crystal 190 may operate in the analog domain. The DCO side of the divider 170 and TDC 160 may also operate in the analog domain. The remaining components may operate in the digital domain.

Figure 2:
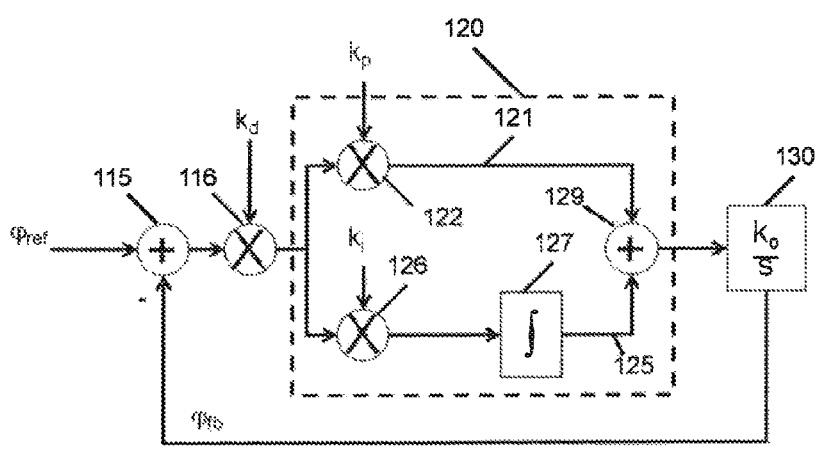
FIG. 2 is a system block diagram used to calculate the phase transfer function for a phase locked loop.

FIG. 2 is a system block diagram for calculation of a phase transfer function for a phase locked loop (similar to that of FIG. 1), comprising a phase detector 115, differential gain block 116, loop filter 120 and DCO 130. The phase detector 115 receives an input reference phase $\varphi_{ref}$ and subtracts the feedback phase $\varphi_{fb}$ output from the DCO 130. The DCO 130 is represented by the transfer s-function $k_o/s$ (i.e. an integrator block with gain $k_o$). The output of the phase detector 115 is multiplied by a differential gain factor $k_d$ at the differential gain block 116. The output of the differential gain block 116 is provided to the loop filter 120.

The loop filter 120 comprises a proportional path 121 and an integral path 125. In the proportional path 121, the output of the differential gain block 116 is multiplied (at proportional gain block 122) by a proportional gain factor $k_p$. In the integral path 125, the output of the differential gain block 116 is first multiplied by an integral gain factor $k_i$ (at integral gain block 126), and then integrated (at integrator 127). The output from the proportional and integral paths 121, 125 are summed at output summing block 129, to provide the loop filter output, which is in turn received at the DCO block 130.

Figure 3:
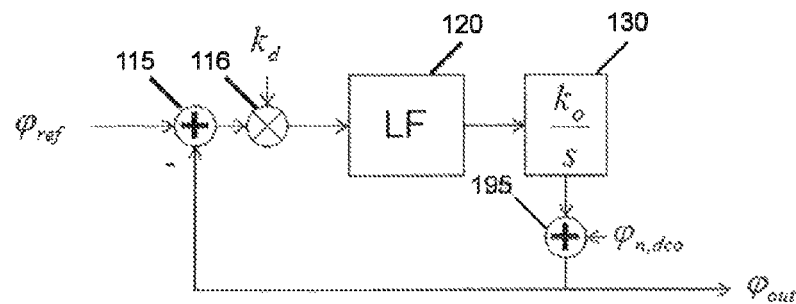
FIG. 3 is system block diagram used to calculate phase transfer function for a phase locked loop, including oscillator phase noise.

This model can be generalised to calculate the phase noise contribution from the phase reference $\varphi_{ref}$ and the noise $\varphi_{n,dco}$ from the DCO, as shown in FIG. 3.

FIG. 3 shows the same model as FIG. 2, but the loop filter 120 has been replaced with a single block, in which LF represents the transfer function of the loop filter 120, and the DCO noise contribution $\varphi_{n,dco}$ has been included by way of a noise adding block 195.

The phase transfer function for the diagram of FIG. 3 can be written as:

$$\varphi_{out} = \varphi_{ref} \cdot \frac{k_d \cdot LF \cdot k_o}{s + k_d \cdot LF \cdot k_o} + \varphi_{n,dco} \cdot \frac{s}{s + k_d \cdot LF \cdot k_o} \quad (1)$$

If the loop filter transfer function is as represented in FIG. 2, this results in:

$$\varphi_{out} = \varphi_{ref} \cdot \frac{k_d \cdot k_p \cdot k_o \cdot s + k_d \cdot k_i \cdot k_o}{s^2 + k_d \cdot k_p \cdot k_o \cdot s + k_d \cdot k_i \cdot k_o} + \quad (2)$$

$$\varphi_{n,dco} \cdot \frac{s^2}{s^2 + k_d \cdot k_p \cdot k_o \cdot s + k_d \cdot k_i \cdot k_o}$$

This can be written in terms of the classical damping factor and natural frequency $\omega_n$, as:

$$\varphi_{out} = \varphi_{ref} \cdot \frac{2 \cdot \xi \cdot \omega_n \cdot s + \omega_n^2}{s^2 + 2 \cdot \xi \cdot \omega_n \cdot s + \omega_n^2} + \varphi_{n,dco} \cdot \frac{s^2}{s^2 + 2 \cdot \xi \cdot \omega_n \cdot s + \omega_n^2} \quad (3)$$

with $k_d \cdot k_i \cdot k_o = \omega_n^2$ and $k_d \cdot k_p \cdot k_o = 2 \cdot \xi \cdot \omega_n$.

It is directly visible from equation (3) that the loop has a low pass (LP) characteristic including the reference phase $\varphi_{ref}$ and a high pass (HP) characteristic including the phase noise from the oscillator $\varphi_{n,dco}$. The bandwidth of the loop filter is defined by the cut-off frequency $\omega_{3\ dB}$ which depends on the natural frequency, $\omega_n$ and the damping factor $\xi$.

Looking at equation (1), the denominator of the reference phase term $\varphi_{ref}$ always has one order less than the denominator. Hence the low pass characteristic has a −20 dB/decade slope, following the cut-off frequency, $\omega_{3\ dB}$. The oscillator phase noise term $\varphi_{n,dco}$, however, depends on the order of the loop filter 120 (as is clear from equation (1)). In the example of equation (3), which is a $2^{nd}$ order system, the oscillator phase noise contribution has a 40 dB/dec slope before the cut-off frequency, $\omega_{3\ dB}$.

Figure 4:
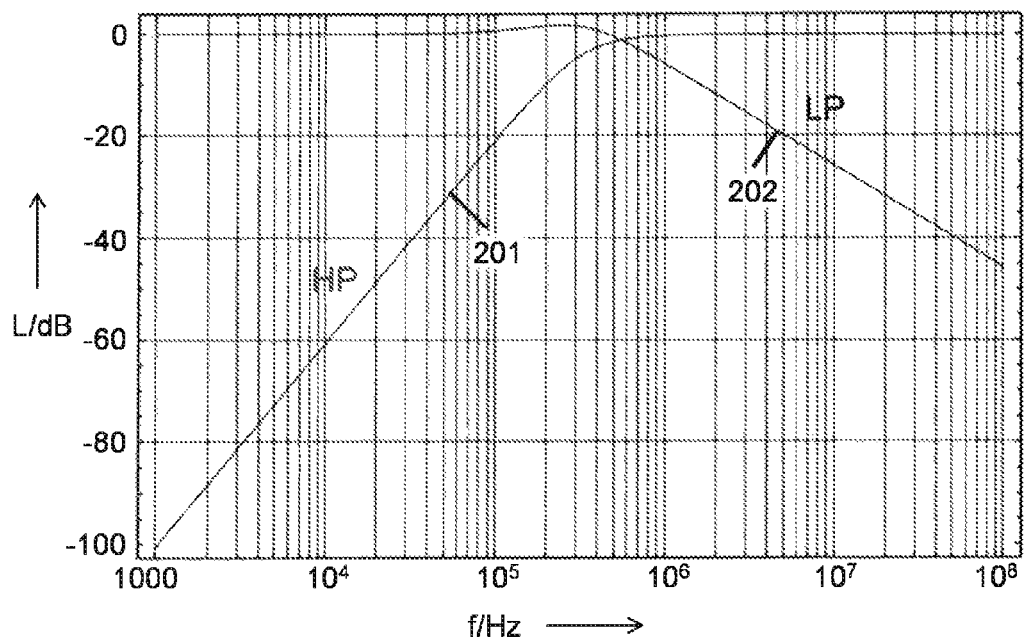
FIG. 4 is a graph showing the high-pass and low-pass characteristics of the transfer function of the system in FIG. 3.

FIG. 4 depicts the phase noise contributions from the HP term 201 and the LP term 202 for the $2^{nd}$ order PLL system of equation (3). In the example of FIG. 4 the bandwidth, $\omega_{3\ dB}$, of the PLL is selected so that the noise contributions from the HP term 201 and the low pass term 202 are similar at the cutoff frequency determined by the PLL bandwidth (where each term starts to roll-off).

Referring back to equation (3), the phase noise contribution to the term $\varphi_{ref}$ from the reference oscillator itself (e.g. crystal 190 in FIG. 1) may be neglected in the frequency range of interest because in this frequency range the reference noise contribution $\varphi_{ref}$ is dominated by the quantization noise arising from the resolution of the phase detector 115. This quantization noise is white noise, and is constant over frequency. Quantisation noise may be represented by the following equation:

$$L_{quant}(f) = \frac{1}{12}\left(\frac{\tau_{res}}{T_{dco}}\right)^2 \frac{1}{2\pi \cdot f_{ref}} \quad (4)$$

where $\tau_{res}$ is the phase detector resolution, $T_{dco}$ the DCO period and $f_{ref}$ the reference frequency.

The noise contributions from the DCO to the term $\varphi_{n,dco}$ include a free running phase noise that has a slope of −30 dB/decade in the flicker noise range, and thermal noise which has a slope of −20 dB/decade above a certain frequency (e.g. between 10 kHz and 100 kHz). Since it is desirable for a phase locked loop to have a high bandwidth, only thermal noise is of interest in the following analysis.

Figure 5:
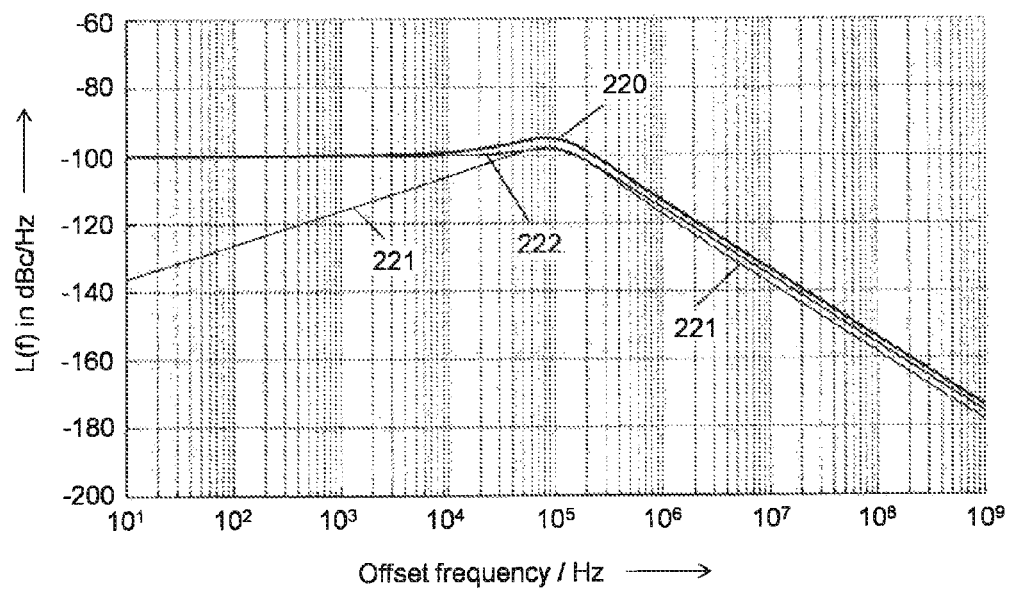
FIG. 5 is graph showing phase noise contributions from quantization noise and oscillator noise for the transfer function of FIG. 3 for a first bandwidth.

FIG. 5 shows a graph that includes DCO thermal noise 221, quantization noise 222 and the total phase noise 220 of the PLL. The DCO thermal noise 221 reduces at −20 dB/decade in the out-of band range (i.e. at frequencies greater than the bandwidth, $\omega_{3\ dB}$), which is the same rate of reduction as the quantization noise (which although white noise, is LP filtered). In this example, near the cut-off frequency, $\omega_{3\ dB}$, the noise contributions from the DCO thermal noise 221 and quantization noise 222 are similar. This results in around 3 dB more total phase noise around $\omega_{3\ dB}$ than the DCO thermal noise contribution, which would be the limiting factor for such a phase locked loop.

For a number of applications (e.g. consumer and automotive communications systems) it is very important to have an out-of-band phase noise that is as low as possible.

Small changes of the phase noise level can have a high impact on the functioning of a system that includes the PLL. An improvement of 1 or 2 dB can have big impact to the complete system. In the example of FIG. 5, any improvements of the DCO phase noise would not have a significant impact because the phase noise is dominated by the quantization noise 222.

Figure 6:
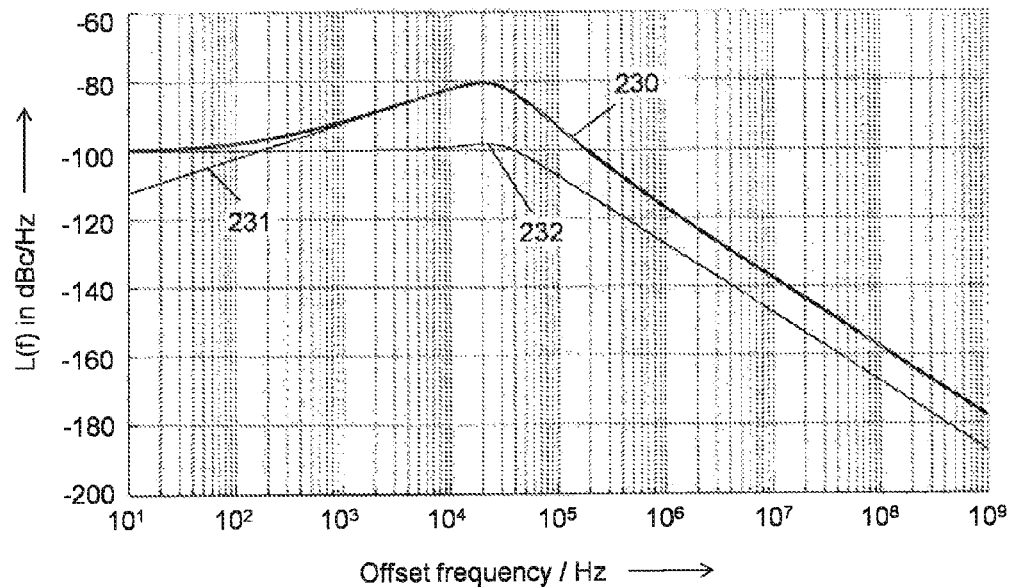
FIG. 6 is a graph showing phase noise contributions from quantization noise and oscillator noise for the transfer function of FIG. 3 for a second, lower, bandwidth.

A trivial solution to the quantization noise dominating the overall phase noise of a PLL is to reduce the bandwidth $\omega_{3\ dB}$, so that the out-of-band phase noise is in fact dominated by the DCO thermal noise. FIG. 6 depicts this, showing DCO thermal noise 231, quantization noise 231 and total phase noise 230. Decreasing the bandwidth of the PLL reduces the cut-off frequency of the LP term in equation (3), which allows the phase noise contribution from the DCO to produce an undesirable peak near the cut-off frequency $\omega_{3\ dB}$. This peak can only be avoided if the DCO phase noise is reduced, but this is very challenging in practice. The DCO design may already be at or near the physical limits of noise performance. A further disadvantage of reducing bandwidth is an increased locking and settling time of the PLL.

Figure 7:
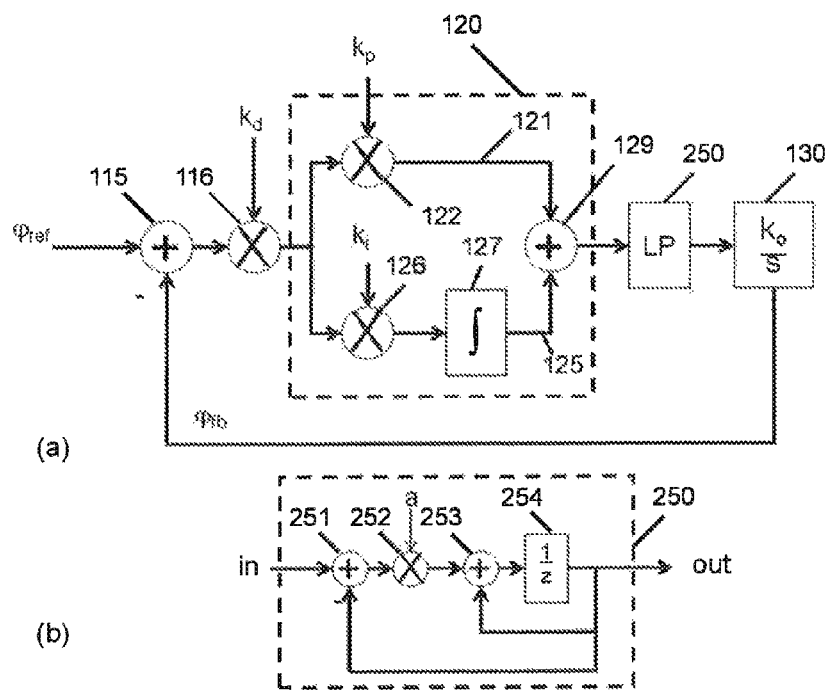
FIG. 7 is a used to calculate the phase transfer function for a phase locked loop according to an embodiment, in which (a) depicts the overall phase locked loop, and (b) depicts an example low pass filter.

FIG. 7(a) shows a PLL architecture that ameliorates the above mentioned issues. The PLL of FIG. 7 is the same as that of FIG. 2, except that an additional low pass filter 250 is included between the loop filter 120 and frequency controlled oscillator 130. In other embodiments, the additional low pass filter 250 can be placed between the loop filter 120 and the phase detector 115, and still provide the same benefits. The additional low pass filter 250 may have a cutoff frequency that is the same as, or higher than the bandwidth of the phase locked loop.

FIG. 7(b) shows an example architecture for the low pass filter 250, comprising a first order infinite impulse response (IIR) filter. The forward path of the low pass filter 250 of FIG. 7(b) comprises (in order) a first summing block 251, multiplier 252, second summing block 253 and unit delay 254. The output from the unit delay 254 is fed-back to the first summing block 251, where it is subtracted from the input signal to the filter 250, and to the second summing block 253, where it is added to the output of the multiplier 252. The multiplier 252 applies a gain factor a to the output of the first summing block 253, and passes the result to the second summing block 253.

The low pass filter 250 of FIG. 7(b) has the following frequency response:

$$\frac{out}{in} = \frac{\frac{a}{z-1}}{1 + \frac{a}{z-1}} = \frac{a}{z-1+a} \xrightarrow{z=e^{sT} \approx 1+sT} \frac{\frac{a}{T}}{s + \frac{a}{T}} \rightarrow \frac{\omega_c}{s+\omega_c} \quad (5)$$

The multiplier 252 may be a shift multiplier, and $a=2^{-klp}$ where klp is the low pass filter factor. The cut-off frequency of the low pass filter 250 may then be calculated as:

$$\omega_c = \frac{a}{T} \rightarrow f_c = \frac{a}{2\pi \cdot T} = \frac{2^{-klp}}{2\pi \cdot T} \quad (6)$$

The overall phase transfer function for the phase locked loop of FIG. 7(a) may then be written as:

$$\varphi_{out} = \varphi_{ref} \cdot \frac{k_d \cdot k_p \cdot k_o \cdot a \cdot sT + k_d \cdot k_i \cdot k_o \cdot a}{s^3 T^3 + a \cdot s^2 T^2 + k_d \cdot k_p \cdot k_o \cdot a \cdot sT + k_d \cdot k_i \cdot k_o \cdot a} + \quad (7)$$

-continued $$\varphi_{n,dco} \cdot \frac{s^3 T^3 + a \cdot s^2 T^2}{s^3 T^3 + \omega_c \cdot s^2 T^2 + k_d \cdot k_p \cdot k_o \cdot \omega_c \cdot sT + k_d \cdot k_i \cdot k_o \cdot \omega_c}$$

or, in terms of $\xi$ and $\omega_n$, as:

$$\varphi_{out} = \varphi_{ref} \cdot \frac{2 \cdot \xi \cdot \omega_n \frac{a}{T} \cdot s + \omega_n^2 \frac{a}{T}}{s^3 + \frac{a}{T} s^2 + 2 \cdot \xi \cdot \omega_n \frac{a}{T} \cdot s + \omega_n^2 \frac{a}{T}} + \quad (8)$$

$$\varphi_{n,dco} \cdot \frac{s^3 + \frac{a}{T} \cdot s^2}{s^3 + \frac{a}{T} s^2 + 2 \cdot \xi \cdot \omega_n \frac{a}{T} \cdot s + \omega_n^2 \frac{a}{T}} =$$

$$\varphi_{ref} \cdot \frac{2 \cdot \xi \cdot \omega_n \cdot \omega_c \cdot s + \omega_n^2 \cdot \omega_c}{s^3 + \omega_c s^2 + 2 \cdot \xi \cdot \omega_n \cdot \omega_c \cdot s + \omega_n^2 \cdot \omega_c} +$$

$$\varphi_{n,dco} \cdot \frac{s^3 + \omega_c \cdot s^2}{s^3 + \omega_c s^2 + 2 \cdot \xi \cdot \omega_n \cdot \omega_c \cdot s + \omega_n^2 \cdot \omega_c}$$

In common with equation (3), equation (8) has low pass (LP) characteristic including the reference phase $\varphi_{ref}$ and a high pass (HP) characteristic including the phase noise from the oscillator $\varphi_{n,dco}$.

Figure 8:
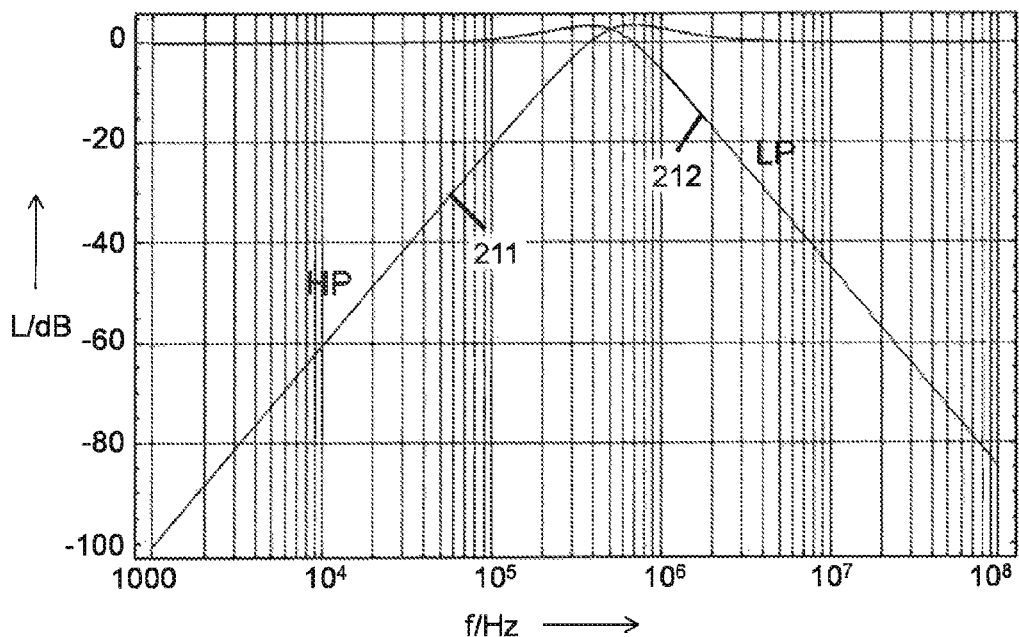
FIG. 8 is a graph showing the high-pass and low-pass characteristics of the transfer function of FIG. 7.

FIG. 8 depicts the phase noise contributions from the HP term 211 and the LP term 212 for the PLL system of equation (8).

Since the order of the denominator of the reference phase term $\varphi_{ref}$ in equation (8) is 3 whereas the numerator is 1, the cut off slope of the low pass behaviour is −40 dB/decade. The suppression of the quantization phase noise is therefore stronger than the slope of the DCO thermal phase noise (at −20 dB/decade).

If the order of the additional low pass filter 250 in FIG. 7(b) was higher (for example second order, such as a second order IIR filter), the slope of the high pass characteristic can be increased (for example to −60 dB/dec in the case of a 2nd order low pass filter 250).

The high pass characteristic of the overall phase locked loop is not changed significantly. For low frequencies the 2nd order term dominates, and the high pass characteristic is still 40 dB/dec as before, as shown in FIG. 8.

Figure 9:
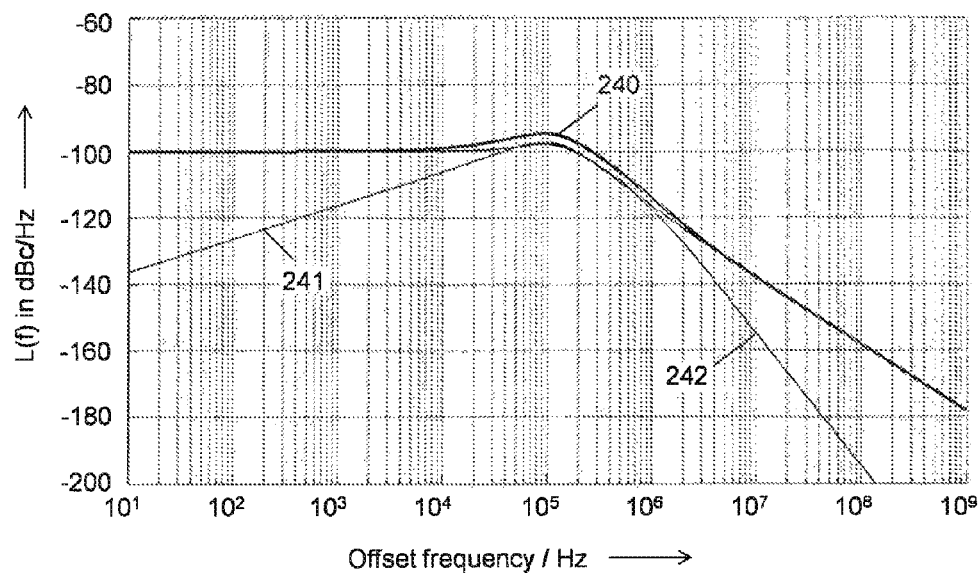
FIG. 9 is a graph showing phase noise contributions from quantization noise and oscillator noise for the transfer function of FIG. 7.

FIG. 9 shows the total phase noise 240 for a PLL as shown in FIG. 7, along with DCO thermal noise component 241 and the quantization noise component 242. In this example, the cut-off frequency $\omega_c$ of the additional low pass filter 250 is 1 MHz, and the PLL bandwidth $\omega_{3\,dB}$ is 100 kHz.

For higher frequencies the slope of the phase detector quantization noise 242 is increased from −20 dB/decade to −40 dB/decade, which results in sufficient reduction of quantization noise for the DCO phase noise 241 to become the dominant source of total phase noise 204.

The performance of a phase locked loop comprising an additional low pass filter has been simulated. A loop filter according to an embodiment (e.g. as shown in FIG. 7) was implemented and the phase noise contribution modeled, based on measurement results.

Figure 10:
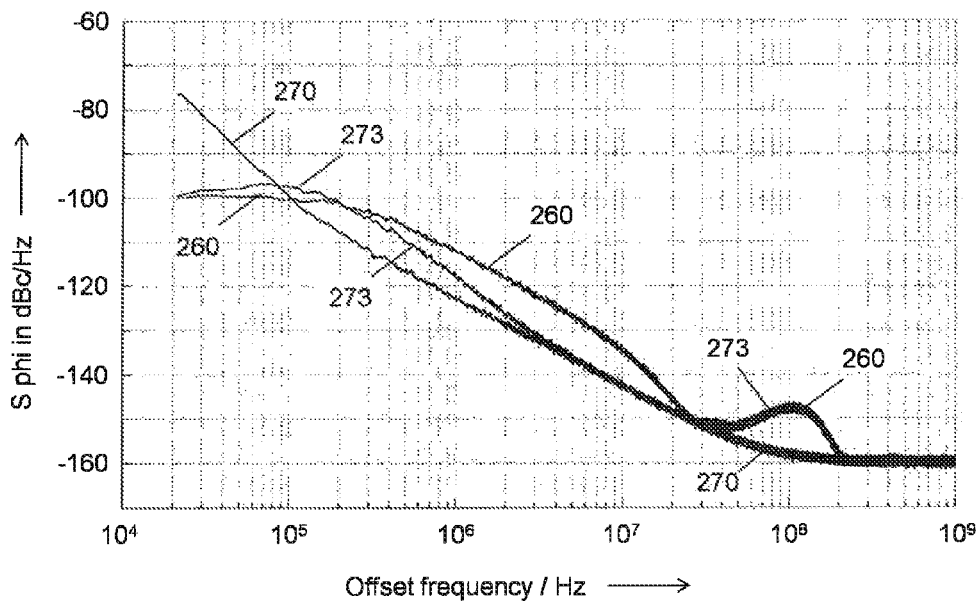
FIG. 10 is a simulation comparing phase noise for: a free running (open-loop) frequency controlled oscillator, a phase locked loop according FIG. 2, and a phase locked loop according to an embodiment.

FIG. 10 shows simulation results, comparing phase noise 270 from a free running (open loop) DCO with phase noise 260 according to the architecture of FIG. 2 (without an additional low pass filter) and phase noise 273 from the architecture of FIG. 7, including the low pass filter 250. For both closed loop phase noise simulations 260, 253, $k_p=2^{-12}$ and $k_i=2^{-19}$. The reference frequency for these simulations is 55.5 MHz. For the phase noise simulation 273 including the low pass filter, klp=3, corresponding with a cut-off frequency $\omega_c$ for the low pass filter 250 of approximately 1.1 MHz. Substantial improvements in phase noise result from the inclusion of the additional filter 250 (e.g. around 10 dB from 3 to 7 MHz, and at least 5 dB from 800 kHz to 10 MHz).

Figure 11:
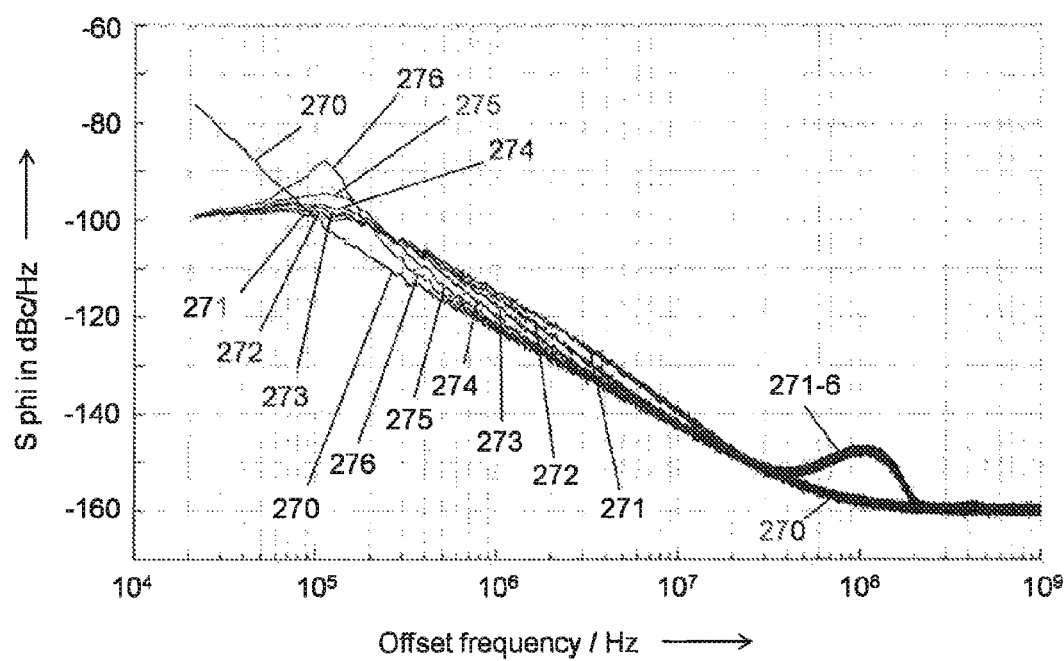
FIG. 11 is a simulation comparing phase noise for: a free running (open-loop) frequency controlled oscillator and a phase locked loop according to an embodiment with different low-pass filter configurations.

FIG. 11 shows the effect of varying the parameter klp of the additional filter 250. Again, the open loop DCO phase noise 270 is shown, along with phase noise simulations 271 to 276, respectively corresponding with klp values of 1 to 6. The cutoff frequencies $\omega_c$ corresponding with each value of klp are shown in the table below.

|  | klp | | | | | |
| --- | --- | --- | --- | --- | --- | --- |
|  | 1 | 2 | 3 | 4 | 5 | 6 |
| $\omega_c$ (MHz) | 4.4 | 2.2 | 1.1 | 0.55 | 0.28 | 0.138 |

As the cut-off frequency $\omega_c$ gets close to the PLL bandwidth $\omega_{3\,dB}$ the PLL may become unstable. The optimum settings for this example PLL may be klp=5, since this provides the largest improvements to phase noise above 300 kHz, and does not introduce the large peak centered just above 100 kHz that is associated with klp=6.

This disclosure shows how the out-of-band phase noise of a PLL system (such as an ADPLL) can be improved by reducing the quantization phase noise contribution from the phase detector in out-of-band frequency range by means of an additional low-pass filter before or after the loop filter. The design effort needed to implement this improvement is quite small. The configuration can be chosen such that the overall loop dynamic is hardly changed. There is no problem with stability (which may occur in more complex arrangements in which the loop filter is modified to try to increase suppression of quantization noise), provided the filter parameters are selected appropriately. According to the disclosure, the phase locked loop may be set to higher loop bandwidths without degrading the out-of-band phase noise performance. The phase locked loop described herein works well in a wide range of applications.

The disclose can be applied in the context of a linear, all digital phase locked loop, as shown in FIG. 7, or in any other controlling scheme that generates quantization noise, for example a PLL in which a bang-bang control scheme is used. A bang-bang mode may be a non-linear controlling mode in which a quantizer is used to determine a phase error (instead of an adder), and the loop filter may be updated by small constant portions accordingly.

From reading the present disclosure, other variations and modifications will be apparent to the skilled person. Such variations and modifications may involve equivalent and other features which are already known in the art of phase locked loops, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, and reference signs in the claims shall not be construed as limiting the scope of the claims.

The invention claimed is:

1. A phase locked loop, comprising:
a phase detector configured to determine a phase difference between a reference signal and a feedback signal;
a digital loop filter configured to perform a filtering operation on a signal derived from the phase difference and to provide three different control signals;
a digitally controlled oscillator configured to receive the three different control signals and provide an output signal with a frequency that varies according to the three different control signals; and
a low-pass filter is provided between the phase detector and the digital loop filter and configured to reduce quantization noise from the phase detector by having a cut-off frequency that is greater than a bandwidth of the phase locked loop.

2. The phase locked loop of claim 1, wherein the phase locked loop has a bandwidth defined by the characteristics of the phase detector, the digital loop filter and the digitally controlled oscillator.

3. The phase locked loop of claim 2, wherein the low-pass filter has a cut-off frequency at least 1.2 times the bandwidth of the phase locked loop.

4. The phase locked loop of claim 2, wherein the low-pass filter has a cut-off frequency that is at least 100 kHz greater than the bandwidth of the phase locked loop.

5. The phase locked loop of claim 1, wherein the low-pass filter comprises a first order Infinite Impulse Response (IIR) filter.

6. The phase locked loop of claim 5, wherein the first order IIR filter further comprises:
a shift multiplier in a forward path thereof, configured to multiply by an integer power of two.

7. The phase locked loop of claim 1, wherein the digital loop filter further comprises:
an integral path comprising an integrator.

8. The phase locked loop of claim 7, wherein the digital loop filter further comprises:
a proportional path.

9. The phase locked loop of claim 8, wherein the phase locked loop is configured with a proportional gain factor $k_p$ in the proportional path and an integral gain factor $k_i$ prior to the integrator in the integral path, wherein:
$k_p \leq 2^{-12}$; $k_i \leq 2^{-18}$.

10. The phase locked loop of claim 1, wherein the digitally controlled oscillator further comprises:
a switched capacitor LC oscillator.

11. A receiver comprising the phase locked loop of claim 1.

12. The receiver of claim 11, wherein the receiver is a satellite radio receiver.

13. The phase locked loop of claim 1, wherein the digital loop filter is configured to provide a process voltage temperature control signal to the digitally controlled oscillator.

14. The phase locked loop of claim 1, wherein the digital loop filter is configured to provide an acquisition control signal to the digitally controlled oscillator.

15. The phase locked loop of claim 1, wherein the digital loop filter is configured to provide a tracking signal to the digitally controlled oscillator.

16. The phase locked loop of claim 1, wherein the digital loop filter is configured to provide the three different control signals to respective switched capacitor banks of the digitally controlled oscillator.

17. A phase locked loop, comprising:
a phase detector configured to determine a phase difference between a reference signal and a feedback signal;
a digital loop filter configured to perform a filtering operation on a signal derived from the phase difference and to provide three different control signals;
a digitally controlled oscillator configured to receive the three different control signals and provide an output signal with a frequency that varies according to the three different control signals; and
a low-pass filter is provided between the digital loop filter and the digitally controlled oscillator and configured to reduce quantization noise from the phase detector by having a cut-off frequency that is greater than a bandwidth of the phase locked loop.

* * * * *